(12) United States Patent
Nakanishi et al.

(10) Patent No.: US 11,340,984 B2
(45) Date of Patent: May 24, 2022

(54) APPARATUSES, SYSTEMS, AND METHODS FOR ERROR CORRECTION

(71) Applicant: MICRON TECHNOLOGY, INC., Boise, ID (US)

(72) Inventors: Takuya Nakanishi, Hino (JP); Toru Ishikawa, Sagamihara (JP); Minari Arai, Niiza (JP)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 16/911,197

(22) Filed: Jun. 24, 2020

(65) Prior Publication Data
US 2021/0406123 A1    Dec. 30, 2021

(51) Int. Cl.
*G06F 11/10* (2006.01)
*G06F 13/16* (2006.01)
*G11C 7/10* (2006.01)
*G11C 7/22* (2006.01)

(52) U.S. Cl.
CPC ...... *G06F 11/1076* (2013.01); *G06F 13/1668* (2013.01); *G11C 7/1009* (2013.01); *G11C 7/22* (2013.01)

(58) Field of Classification Search
CPC ............ G06F 11/1076; G06F 13/1668; G11C 7/1009; G11C 7/22
See application file for complete search history.

(56) References Cited

U.S. PATENT DOCUMENTS

| | | | |
|---|---|---|---|
| 2014/0317470 A1* | 10/2014 | Chung | G06F 11/1076 714/764 |
| 2019/0324854 A1* | 10/2019 | Park | G06F 11/1076 |
| 2020/0371869 A1* | 11/2020 | Park | G06F 11/1016 |
| 2021/0005276 A1* | 1/2021 | Nakaoka | G11C 7/1048 |
| 2021/0073071 A1* | 3/2021 | Nakaoka | G06F 11/1068 |

* cited by examiner

*Primary Examiner* — Kyle Vallecillo
(74) *Attorney, Agent, or Firm* — Dorsey & Whitney LLP

(57) ABSTRACT

Apparatuses, systems, and methods for error correction. A memory array may be coupled to an error correction code (ECC) circuit along a read bus and a write bus. The ECC circuit includes a read portion and a write portion. As part of a mask write operation, read data and read parity may be read out along the read bus to the read portion of the ECC circuit and write data may be received along data terminals by the write portion of the ECC circuit. The write portion of the ECC circuit may generate amended write data based on the write data and the read data, and may generate amended parity based on the read parity and the amended write data. The amended write data and amended parity may be written back to the memory array along the write bus.

19 Claims, 9 Drawing Sheets

APPARATUSES, SYSTEMS, AND METHODS FOR ERROR CORRECTION

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

DETAILED DESCRIPTION

Figure 1:
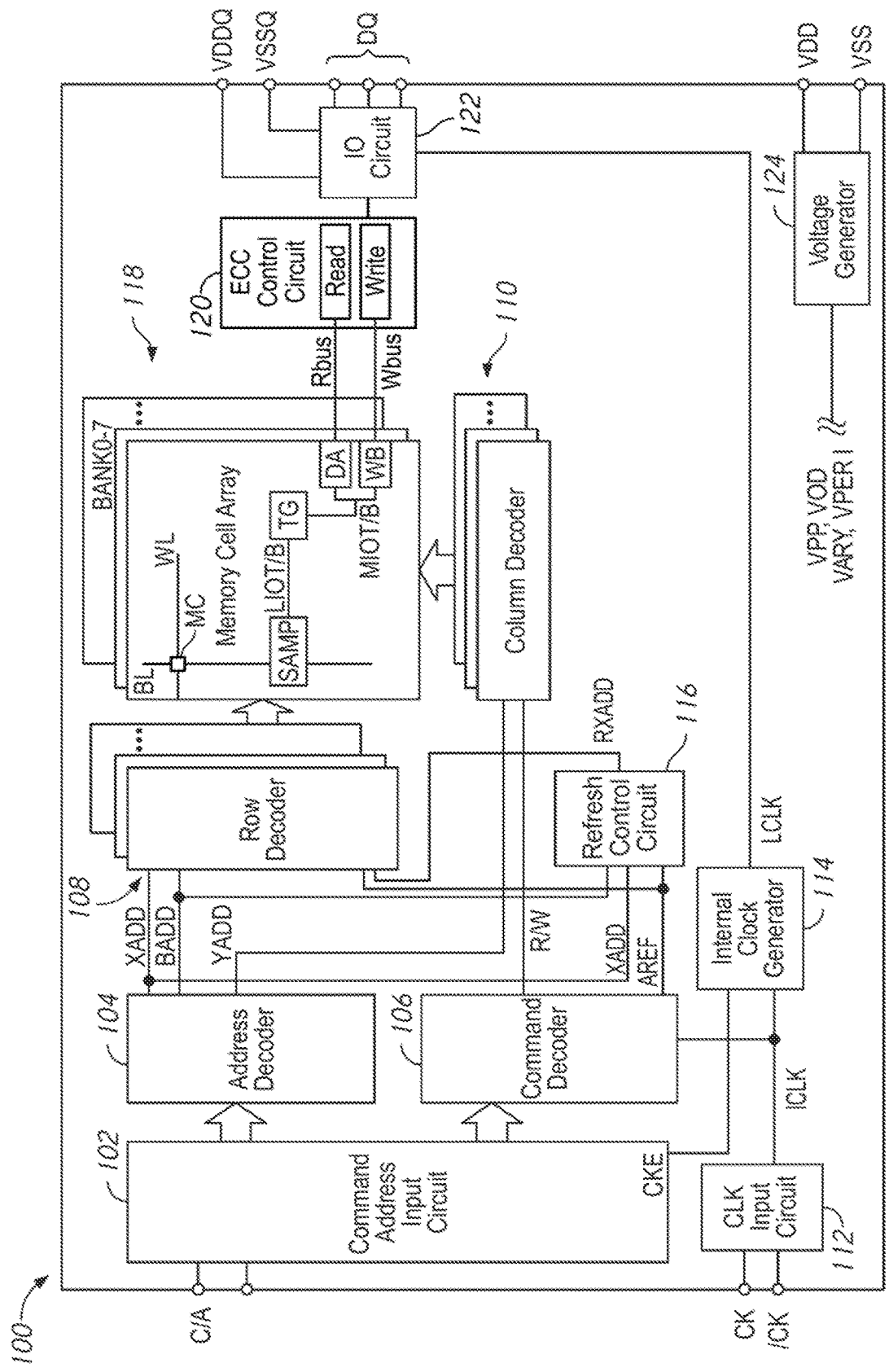
FIG. 1 is a block diagram of a semiconductor device according to some embodiments of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row and column may be activated, and data may be read from, or written to, the memory cells at the intersection of the activated row and column. Data stored in the memory array may include a number of bits of data and a number of parity bits, which may be used to check the integrity of the data bits. The information encoded in the parity bits may be used to correct up to a maximum number of errors. For example, a set of data may include i data bits and k parity bits, which may be used to correct up to j of the data bits. The parity bits may be generated by an error correction code circuit based on the data written to the memory cells of the memory array. During a read operation the error correction code circuit may use the parity bits to determine if the read data bits are correct, and may correct any errors which are found.

The memory device may also perform mask write operations, where a set of data is read out from the memory array, and a portion of the read data is replaced with new data (e.g., from data terminals of the memory) before the amended data set is written back to the memory array (e.g., to the same memory cells which were read). Parity bits may also be generated and written to the memory array as part of the mask write operation. For example, as part of a mask write operation, an error correction code (ECC) circuit may receive data read from the memory array, as well as new write data, amend the read data by replacing a portion of the bits with the new write data, generate parity bits based on the amended data set (e.g., by amending the parity bits based on the read data to reflect the amended data), and then write the amended data and amended parity back to the memory array. The mask write operation may form a bottleneck in the timing of a memory, since the mask write operation requires both read and write operations in the memory. This may cause problems if, for example, a new command is received which would use the ECC while the ECC is still processing a previous mask write operation. Accordingly, there is a need to streamline the timing of ECC components and other portions of the read and write path.

The present disclosure is directed to apparatuses, systems, and methods for error correction. A memory device may include a data terminals and a number of memory banks. Write data may be coupled from the data terminals through a write portion of the ECC circuit along a write bus to the memory banks. Read data may be coupled from the memory banks along a read bus to a read portion of the ECC circuit and then out to the data terminals. During a mask write operation, multiple timing domains may be used (e.g., a first domain for a first set of components, a second domain for a second set of components, etc.). The multiple timing domains may allow data from different commands (e.g., a first mask write command and a second mask write command) to move through the ECC circuits without interfering with each other.

In an example mask write operation, a first clock domain may be used to manage reading data out from the memory array. A second clock domain may be used to manage transferring the read data along the read bus to the read ECC circuit. A third clock domain may be used to manage checking the parity for errors and transferring the corrected parity information to the write ECC circuit. A fourth clock domain may manage receiving write data from the data terminals updating the parity information and amending the read data and parity so it can be written back along the write bus to be written to the memory bank. By splitting mask write operations up between different buses and different clock domains, even if the masked write operation takes longer than the timing between commands, multiple commands may be still be processed.

FIG. 1 is a block diagram of a semiconductor device according some embodiments of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled through a data amplifier (DA) to a read error correction code (ECC) control circuit 120 along a read bus. Conversely, write data outputted from the write ECC control circuit 120 is transferred to the sense amplifier SAMP over a write bus through a write buffer (WB) to complementary main data lines MIOT/B, through the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. In some embodiments, data strobe signal (DQS) may be used to time operations of the IO circuit 122.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided along the read bus (RBus) to a read portion of the ECC control circuit 120. The read command may also cause one or more parity bits associated with the read data to be provided along the read bus to the ECC control circuit 120. The ECC control circuit 120 may use the parity bits to determine if the read data includes any errors, and if any errors are detected, may correct them to generate corrected read data. The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. A write portion of the ECC control circuit 120 may generate a number of parity bits based on the write data, and the write data and the parity bits may be provided to the memory array 118 along a write bus (WBus) to be written into the memory cells MC.

The device 100 may receive an access command which is a mask write command. Non-mask write commands may expect a certain amount (e.g., a certain number of bits) of data to be written to the memory array. The mask write command may be used when less than that amount of data is transmitted across the DQ terminals. As part of the mask write operation, the device 100 may receive a mask command, and a bank address, a row address, and a column address along with write data. The device 100 may also receive mask information (e.g., a mask signal DM), which may indicate which portions of the supplied addresses should not be written to. As part of the mask write operation, the device 100 may first read out information (e.g., read data and read parity) from the rows, columns, and banks of the memory array 118 specified by the respective row column and bank addresses. This information may be read out along the read bus to a read portion of the ECC circuit 120. Write data may be loaded from the data terminals DQ through the IO circuit 122 to a write portion of the ECC circuit 120. The ECC circuit 120 may generate amended write data by replacing certain bits of the read information with the write data from the DQ terminal as specified by the mask signal. The ECC circuit 120 may generate amended parity information based on the amended write data, and may then provide the amended data and parity along the write bus to be written back to the rows, columns, and banks specified by the addresses.

The device 100 may operate based on a specification, which may define certain timing for various operations. For example, access operations (read, write, and mask write) may have a minimum timing tCCD. In other words, if an access command is received, the time tCCD must elapse before the next access command may be received by the device 100. The minimum command timing tCCD may be measured in cycles of the system clock CK (and/or the internal clock ICLK, described herein). For example, the timing tCCD may be 8 clock cycles. Longer or shorter durations of tCCD (e.g., 4, 6, 10, or 12 clock cycles) may be used in other example embodiments. The length of tCCD may be based on a length of time which individual components of the read and write path are occupied during a read and/or write operation.

Since a mask write operation requires both reading and writing, a mask write may occupy components of the read and write path for longer than tCCD. For example, the mask write may take 4*tCCD (e.g., 32 clock cycles) to perform. Since the ECC circuit 120 is shared between multiple banks, if a first bank receives a first mask write command at a first time, and a second bank receives a second command at a second time which is tCCD after the first time, there may be an overlapping need for various components of the ECC circuit 120 and/or other components of the read/write path. For example, one bank may be reading data out along a bus to the ECC circuit 120 while data is being sent from the ECC circuit 120 along the bus back to the other bank.

Each ECC circuit 120 may include certain components which are shared between a read path and a write path, and certain components which are not shared. For example, each ECC circuit may include a logic tree, which may be a group of logic circuits coupled together to receiver a first number of data bits and provide a second number of encoded bits, where the number of encoded bits is less than the number of data bits, and the state(s) of the encoded bits are based on the states of the data bits. There may be a write logic tree and a read logic tree, so that operations (such as write mask operations) which require both read and write operations, are not bottlenecked by both needing to use the same logic tree. Similarly, the use of a separate read bus (RBus) and write bus (WBus) may be used to prevent a bottleneck. Thus, data may be read out along the read bus RBus to a read portion of the ECC circuit 120, while the write portion of the ECC circuit 120 is providing write data along the write bus WBus.

The ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit 122 and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. For example, the ECC control circuit 120 may be able to locate and correct up to one error in the 128 data bits based on the 8 parity bits. In a mask write operation, the ECC control circuit 120 may receive 128 read bits and 8 parity bits from the memory array, replace some number of those bits with new data from the data terminals DQ, amend the parity bits, and write back 128 write bits and 8 parity bits. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
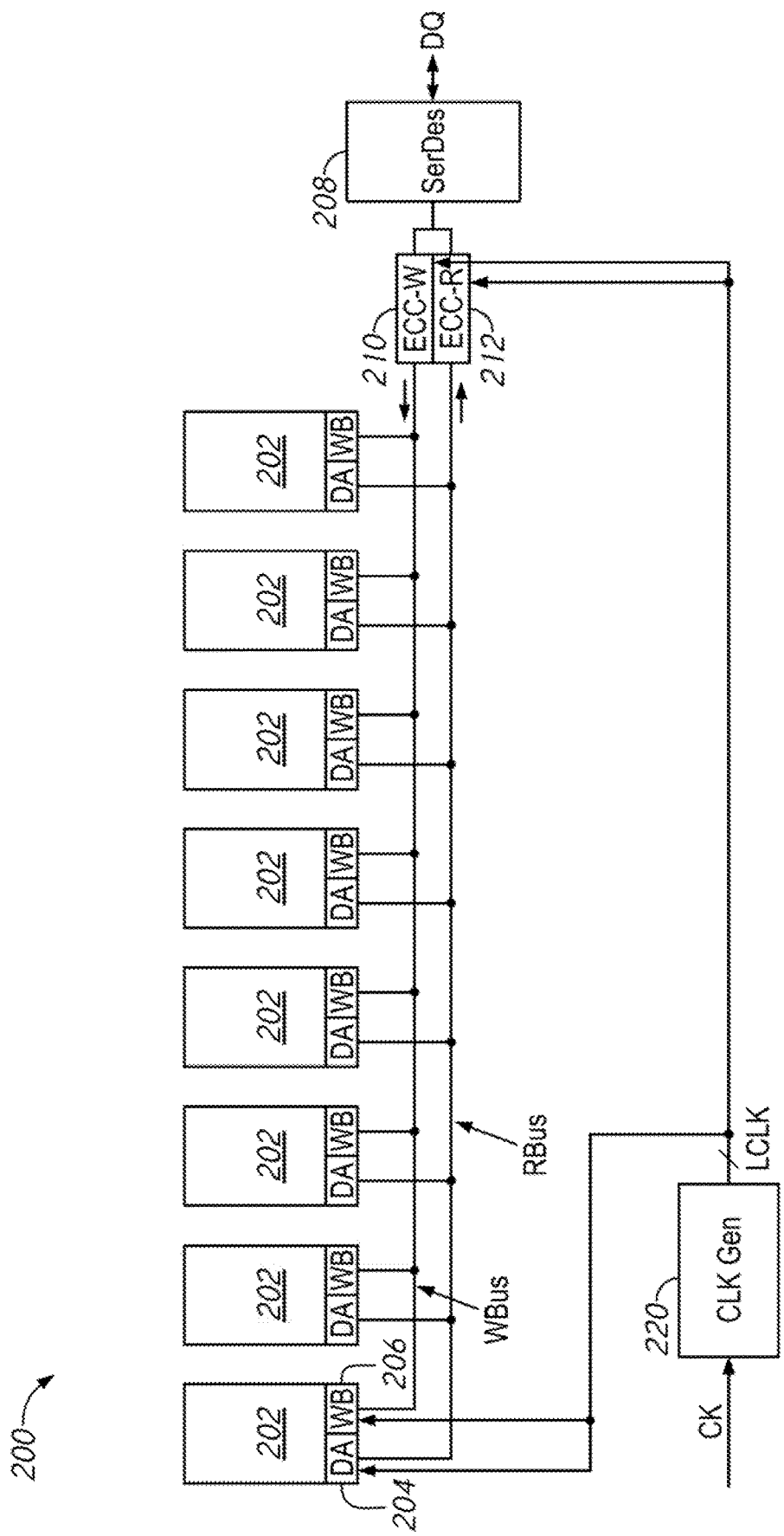
FIG. 2 is a block diagram of a read and write paths of a memory according to some embodiments of the present disclosure.

FIG. 2 is a block diagram of a read and write paths of a memory according to some embodiments of the present disclosure. The memory 200 is a view of a portion of a memory device, such as the device 100 of FIG. 1. The memory 200 is a simplified view which shows various components related to a read and write path from the data terminals DQ. Other components have been omitted for brevity.

The memory 200 includes a number of memory banks 202. Each bank 202 has a data amplifier (DA) 204 and a write buffer (WB) 206. The data amplifier 204 may, in some embodiments, represent the sense amplifier (SAMP) of FIG. 1. While a single data amplifier 204 and write buffer 206 are shown for each bank 202 in the example of FIG. 2, it should be understood that there may be any number of data amplifiers 204 and/or write buffers 206 per bank and that number of data amplifiers and write buffers in a given bank may be different from each other.

When a given bank is activated, along with a row and column of that bank, data may be read out along a bit line to data amplifier 204 which may then provide that data along a shared read bus RBus. Each bank 202 also includes a write buffer 206, which receives data from the write bus and then provides it to memory cells at the intersection of activated rows and columns. Each of the banks 202 may be coupled in common to the read bus RBus and write bus WBus. In some embodiments, there may be multiple read buses and write buses each coupled to multiple banks (in which case the components of FIG. 2 may be repeated for each pair of buses).

The data terminals DQ may be used to send and receive data to the memory 200. The data terminals DQ may receive a large amount of data in series, and an IO circuit 208 may be used to convert between the serial data format of the DQ terminals and the parallel data of the memory device 200. For example, as part of a write operation, a given DQ terminal may receive 8 bits in series as part of a burst, and a deserializer circuit of the IO circuit 208 may convert that into 8 bits in parallel, which may then be provided to the write ECC circuit 210. Similarly, as part of a read operation, a read ECC circuit 212 may provide 8 bits in parallel to a serializer of the IO circuit 208, which may combine those into 8 bits in series along a DQ terminal. During a (non-mask) write operation or a read operation several data terminals may each have a burst of multiple bits (e.g., 16 terminals at a burst of 8 bits each for 128 total bits). During a mask write operation, a burst may be provided along less than all of the data terminals (e.g., an 8 bit burst along 2 terminals for 16 total bits).

The memory 200 also includes a clock generator circuit 220 (e.g., 114 of FIG. 1) which receives an external clock signal CK (and/or a buffered internal clock signal such as ICLK of FIG. 1) and provides multiple local clocks LCLK. The different LCLK signals may be used to control various operations along the read and write path. For example, read and write portions of the ECC circuit 210 and 212 may receive different local clock signals from each other. This may allow the read and write portions 210 and 212 to function independently, for example during a mask write operation.

Different local clock signals may have different timings. For example, each local clock signal may have a pulse after a specified number of cycles of the system clock CK. Local clocks LCLK with different timing may be provided to different components to control their timing relative to each other. Other local clock signals may be oscillating signals, with a frequency based on the system clock. Other local clock signals LCLK may have timings which are independent of the system clock CK. Different clock signals and their use in a mask write operation is detailed in more detail in FIG. 3.

The use of separate read and write paths such as a read path including a read bus Rbus and a read portion of the ECC circuit 212 and a write path including a write bus WBus and write portion of the ECC circuit 210 means that data may travel along both the read and write path simultaneously. For example, if commands are being received with the fastest possible timing (e.g., a new command every tCCD clock cycles), then during a mask write operation, there may be a time where a data associated with a first access command is being read out along the read bus RBus while data associated with a second access command is being written along the write bus WBus. Similarly, during a mask write command, both portions of the ECC circuit 210 and 212 may be in use simultaneously to process the parity from the read data and the new write data.

Figure 3:
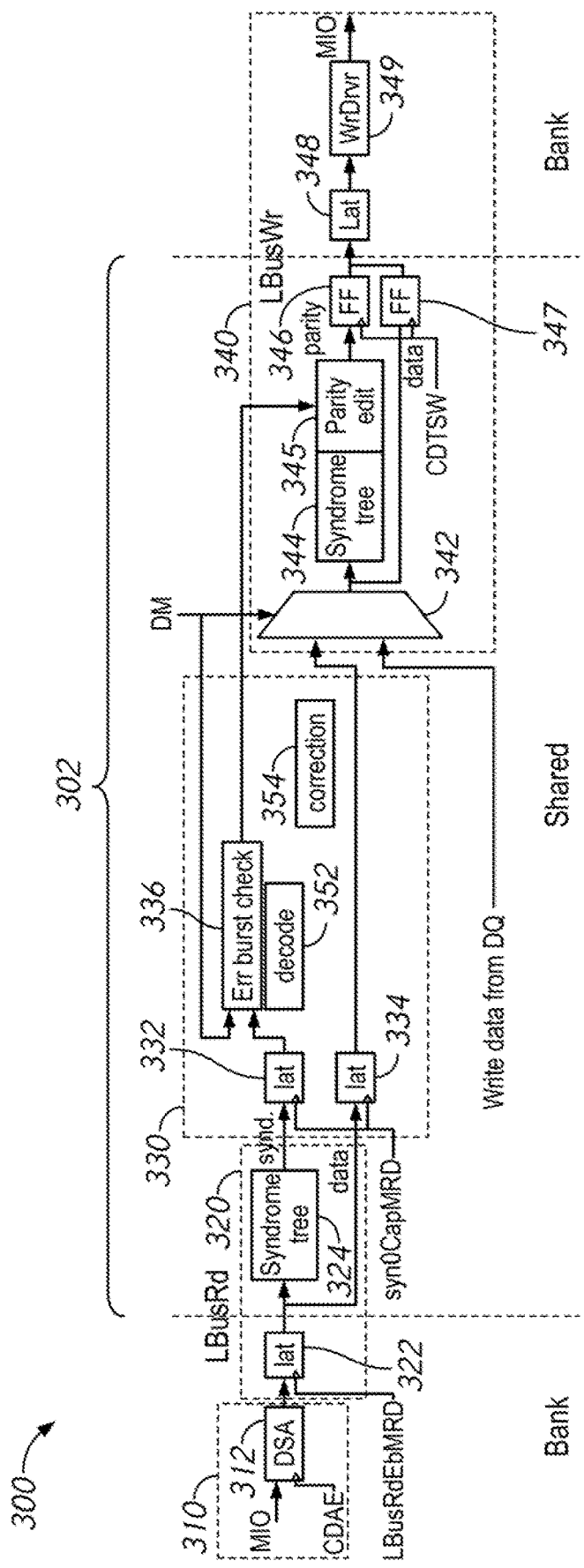
FIG. 3 shows a portion of a memory device used in a mask write operation according to some embodiments of the present disclosure.

FIG. 3 shows a portion of a memory device used in a mask write operation according to some embodiments of the present disclosure. The memory 300 may, in some embodiments, be included in the memory 100 of FIG. 1 and/or 200 of FIG. 2. In the memory 300 of FIG. 3, certain components have been omitted. The memory 300 shows an ECC circuit 302 which is shared between multiple banks of a memory, while other components of the memory 300 shown in FIG. 3 are bank specific. For example, the sense amplifier 312, latch 322, latch 348, and write driver 349 may be associated with a specific bank. Accordingly, the bank associated components may be repeated multiple times for each bank, and may also be repeated for each bank and may be coupled in common to the ECC circuit 302. For clarity, only a single set of bank associated components are shown.

The memory 300 includes a set of components, which operate based on multiple different clock domains as part of a mask write operation. In the example of FIG. 3, four different clock domains are shown, a mask read clock domain 310, a read bus domain 320, a syndrome domain 330, and a write domain 340. Each domain may be associated with a different clock signal (e.g., a mask read clock, a read bus clock, a syndrome clock, and a write domain clock, respectively). The different clock domains may represent a group of components which have timing based on a particular clock signal and/or on signals derived from that clock signal.

Each of the timing domains 310, 320, 330, and 340 may be based on different clock signals, which may be used to manage the operation of components within that timing domain so that mask write commands issued to different banks can be operating in different parts of the memory 300. For example, the components of the first timing domain 310 may be processing a mask write command issued to a first bank, while at the same time the components of the second timing domain 320 may be processing a mask write command issued to a second bank. In some embodiments, the different timing domains may be used to sequentially process different commands issued to the same bank.

Each timing domain may receive a clock signal which activates, and the clock signals may be separated by less than a minimum timings between commands (e.g., tCCD or less). For example, if the time tCCD is about 8 clock cycles long, then the components of the second timing domain 320 may be activated about about 6 clock cycles after the components of the first timing domain 310 were activated, the components of the third timing domain 330 may be activated about 8 clock cycles after the second timing domain 320 is activated, and the components of the fourth timing domain 340 may be activated about 7 clock cycles after the third timing domain 330 is activated. Different lengths of operation time for the timing domains may be used in other examples. Since a mask write operation requires a relatively long time to perform as well as both read and write components, the number of timing domains may be chosen based on the length of a mask write command compared to the speed at which new commands may be received. For example, the memory 300 is laid out based on a mask write operation taking 4*tCCD or less clock cycles to perform. Since each timing domain is activated in tCCD or less time, there are four timing domains 310, 320, 330, and 340. More or fewer timing domains may be used in other examples.

In this manner, a first mask write command may be issued to a first bank and the components of the first time domain 310 may begin processing it. Assuming the fastest possible operation, at a time tCCD later, a second access command is received and the components of the first time domain 310 may begin processing it. However, by then, the second time domain 320 has taken over processing the first mask write command. The timing of various operations is described in more detail in FIGS. 4-5.

The memory 300 includes a data sense amplifier (DSA) 312. The DSA 312 may be part of a mask read clock domain 310. The DSA 312 may be coupled to a main input/output lines MIO, which may couple the DSA to an activated bit line of the memory array. The DSA 312 may receive a bit of information along the MIO and may latch it responsive to a column activation signal CDAE. The column activation signal CDAE may be provided with timing based on a mask read clock signal of the mask read domain 310. The DSA 312 may amplify or otherwise modify the bit signal received from the MIO.

The DSA 312 provides the amplified bit to the read bus time domain 320. A latch 322 stores the information provided by the DSA 312. The latch 322 is clocked to a read bus enable signal LBusRdEnMRD. The read bus enable signal LBusRdEnMRD may be provided with timing based on a read bus clock signal. The latch 322 may help transition the data from the mask read domain 310 to the read bus domain 320. The data stored in the latch 322 (along with data from other similar latches) are provided along a common read bus LBusRd as inputs to a read syndrome tree 324. Accordingly, the DSA 312 and latch 322 may both be proximal to the memory bank they are associated with, while the syndrome tree 324 may be in a shared region of the memory 300. The syndrome tree 324 may be part of a read portion of an ECC circuit 302.

The syndrome tree 324 may include a number of logic gates, and may generate syndrome information based on the state of the read data received along the read bus. The syndrome information may be based on the state of one or more data bits read out along the read bus LBusRd. For example, 8 syndrome bits may be generated based on 128 data bits. An example syndrome tree, is described in more detail in FIGS. 6A-6C.

The syndrome tree 324 may receive both the read data from the memory array as well as the read parity associated with that read data along the read bus LBusRd. The syndrome tree 324 may generate a parity based on the read data and compare this parity to the read parity (e.g., using XOR logic). Based on this comparison, the syndrome tree 324 may generate read syndrome information, which may indicate if (and where) there are any differences between the read parity and the generated parity based on the read data. These differences may indicate discrepancies between the read data at the time it was written and the time it was read, and the syndrome information may be used to correct such discrepancies.

The syndrome tree 324 provides the syndrome to components of the syndrome domain 330, and the latch 322 provides the read data to the syndrome domain 330. In particular, a latch 332 may receive the syndrome information while a latch 334 may receive the data. The latches 332 and 334 may be clocked to a syndrome signal syn0CapMRD, which may be (or may be based on) a syndrome clock signal which governs the syndrome clock domain 330. The latch 332 provides the syndrome to an error burst check circuit 336. The error burst check 336 may review the syndrome information to determine if there are any errors in the syndrome information. The error burst check 336 may send information about any detected errors to the parity editor 345. For example, the error burst check circuit 336 may provide information which encodes a location within the syndrome where an error is located.

During a mask write operation, the error burst check circuit 336 may also receive the data mask signal DM. The data mask signal DM may indicate if a detected error is associated with a bit of data which is masked (e.g., maintained) or unmasked (e.g., about to be overwritten by new write data from the DQ terminals). The error burst check circuit 336 may receive the DM signal and may use the DM signal to determine if any of the error bits are masked. If the DM signal indicates the detected error bit is unmasked, the memory 300 may take no action to repair the detected error (e.g., since the error will be "fixed" when that bit is overwritten). If the DM signal indicates that the detected error bit is masked, the memory 300 may update the state of the parity provided by syndrome tree 344 (e.g., with parity edit circuit 345). In some embodiments, the error in the read data may be corrected before it is written back to the memory array (e.g., by using a correction circuit between the multiplexer 342 and the latch 347). In some embodiments, the error in the read data may be written back as-is to the memory array. The error burst check circuit 336 may provide a signal which indicates if a given bit should be corrected or not based on the syndrome information and the DM signal.

Write data from the data terminals DQ is provided as an input to a multiplexer 342, along with the data read from the memory array (e.g., stored in latch 334). The multiplexer 342 may have a selector terminal coupled to a data mask signal DM. The data mask signal DM may indicate which bits of the read data should be replaced with new write data from the DQ terminals, and which of the read data should be written back to the memory array. Accordingly, the multiplexer 342 may generate amended data by replacing certain read bits with the write data from the DQ terminals. The syndrome may operate with timing based on the write domain 340.

The multiplexer 342 provides the amended data to a syndrome tree 344. The syndrome tree 344 may, in some embodiments, be similar to the syndrome tree 324. In some embodiments, the two syndrome trees 324 and 344 may have identical logic except that the syndrome tree 342 may have extra XOR logic which compares the read parity to the generated parity, while the syndrome tree 344 may generate a parity, but not compare it. The syndrome tree 344 provides parity information based on the amended write data. The parity information is provided to a parity edit circuit 345, which uses the syndrome error information from the error burst check circuit 336 to edit the syndrome provided by the syndrome tree 344. The parity edit circuit 345 may correct errors in the syndrome provided by the syndrome tree 344. The parity edit circuit 345 may provide parity to a latch 346. A latch 347 may receive the amended data from the multiplexer 342.

The parity edit circuit 345 may include an XOR logic gate with an input coupled to the read syndrome information (e.g., from syndrome tree 324) and an input coupled to the write parity provided by the syndrome tree 344. The XOR gate provides a signal which indicates if the read syndrome is different from the write parity. The output of the XOR gate is coupled to a multiplexer, which has another input terminal coupled to the write parity from syndrome tree 344. The multiplexer has a selection terminal coupled to a signal from the error burst check circuit 336 which indicates if the write parity needs to be edited or not. If not, the write parity is passed through the multiplexer as the parity. If so, the output of the XOR gate is used as the output of the multiplexer as the parity.

The latches 346 and 347 may be coupled to a write column select signal CDTSW, which may be part of the write domain 340. The latch 347 may store the amended write data (e.g., the mix of the read data and the new data from the DQ terminals) while the latch 346 stores the corrected parity associated with the amended write data. The latches 346 and 347 provide the amended data and parity along a write bus LBusWr to bank associated circuits, such as latch 348. The latch 348 may store the amended write data and the parity information until it is time to write it to the memory array.

The latch 348 provides the amended write data and the syndrome data to a write driver 349 (e.g., 206 of FIG. 2) which writes the information to a memory cell of the memory array along the MIO bus.

In addition to the components described in FIG. 3 as part of the mask write operation, the memory 300 may also include components used in a read operation such as the decoder 352 and correction circuit 354. These circuits are shown as disconnected from the other components, since they are not used as part of the mask write operation, however it should be understood that additional couplings and selectors (e.g., multiplexers and switches) may be used to couple the decoder 352 and correction circuit 354 to various other components during a read operation.

During a read operation, read data and parity may be read out through DSA 312 to latch 322. The read data may be provided along the read bus and used as an input to the syndrome tree 324, and also passed to the correction circuit 354. The syndrome tree 324 may generate syndrome information based on the read data, which may be provided to the decoder circuit 352. The decoder circuit 352 may decode the syndrome information into a signal which indicates which bit(s) are in error. The correction circuit 354 may alter one or more bits of the read data based decoded signal from the decoder circuit 352. The corrected read data may then be provided to the data terminals DQ to be read off the memory 300.

During a (non-mask) write operation, the components of the write domain 340 may be used in a manner generally similar to previously described, except that the multiplexer 342 and parity edit circuit 345 may not be used. Instead, the syndrome tree 344 may generate syndrome information, which may be encoded into parity information. The parity information and data from the DQ terminals may then be passed along the write bus and written to memory cells of the memory array.

Figure 4:
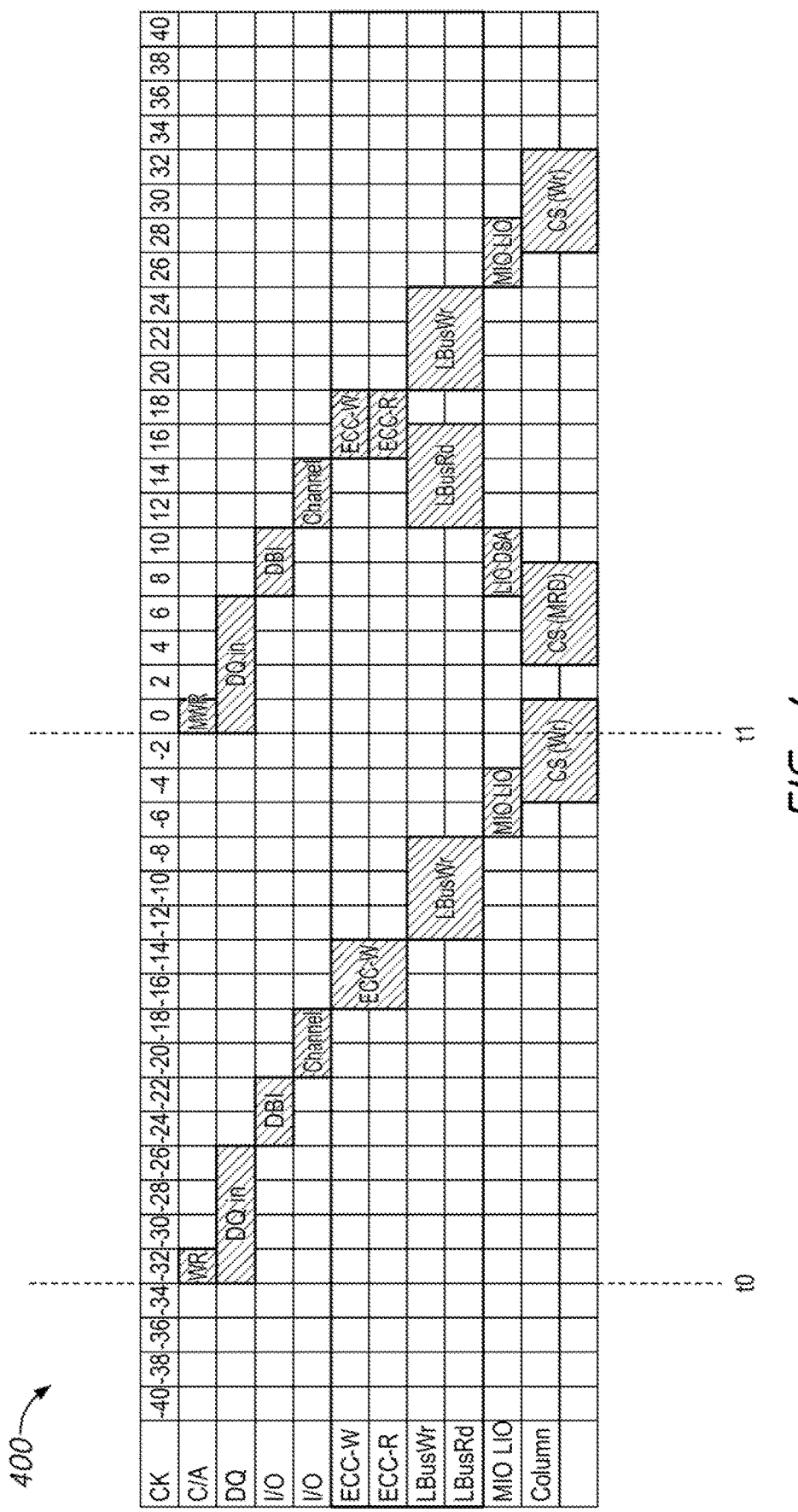
FIG. 4 is a timing diagram of operations in a memory device according to some embodiments of the present disclosure.

FIG. 4 is a timing diagram of operations in a memory device according to some embodiments of the present disclosure. The timing diagram 400 may, in some embodiments, represent the operations of a memory such as the memory 100 of FIG. 1 and/or 200 of FIG. 2. The timing diagram 400 represents operations within a single bank (e.g., bank 202 of FIG. 2).

The horizontal axis of the timing diagram 300 shows time represented in number of cycles of the system clock CK. The vertical axis represents different functional components of the memory, with a block indicating that the functional component is performing the labelled task for the specified length of time. The origin of the horizontal axis has been set at a first time t1, when an internal masked write (MWR) command is issued. The internal masked write command may be issued responsive to a masked write command received by the memory (e.g., from a controller). Accordingly, the command at an initial time t0, which is at −32 on the horizontal axis, may indicate that the initial time t0 is 32 clock cycles before the first time t1. It should be understood that the timing shown in FIG. 4 is for exemplary purposes only, and that other timings may be used in other operations.

At a time before the initial time t0, the memory receives a write command WR along a C/A terminal. At the time t0, the memory issues an internal write command WR. At roughly the same time, the memory begins receiving write data along the DQ terminals. After receiving the data (e.g., for 8 clock cycles, one for each of 8 serial bits), at data bus inversion (DBI) circuit of the I/O circuit may begin deserializing the data, which may be subsequently provided along a channel by the I/O circuit. The channel may couple the I/O circuit to the write ECC circuit.

After the data is provided along the channel (e.g., at about time −16), a write portion of the ECC circuit (ECC-W) may process the write data. For example, a write syndrome tree (e.g., 344 of FIG. 3) may generate a syndrome which may be encoded into a parity. The write data and the generated parity may then be provided along a write bus (LBusWr) to the memory banks. The process of generating the parity and providing the data and parity along the write bus may take about 10 clock cycles (e.g., from about −16 to about −6).

In the memory bank (e.g., the memory bank activated by the bank address) the write data and the parity may be loaded along the input/output buses of the memory array such as the main input/output MIO and the local input/output LIO. As the data is loaded along the main and local buses, it may start being provided along individual columns of the memory. The columns may be specified by a column select signal CS. The data bits and parity bits may be written to the memory cells at the intersection of the activated columns and activated rows.

As may be seen from the timing diagram 400, the longest any component in the write path is in use during a (non-mask) write operation is about 8 clock cycles. This represents the timing tCCD. Different timings may be used in other example embodiment memories.

At or before a first time t1, the memory may receive a mask write (MWR) command at the C/A terminal. At the first time t1, the memory may issue an internal MWR command. Along with the mask write command (e.g., at C/A terminals of the memory) the memory may also begin receiving write data at the DQ terminals. This may be generally similar to the write operation that began at t0. In addition to receiving data at the DQ terminals, slightly after the MWR command is received, the memory may begin reading data from the memory array. This may involve activating a column select CS signal of the memory to activate one or more columns in order to read data from a memory cell (at an intersection with an active row) along the column. Reading data from the memory array (e.g., by activating the CS signal) may overlap with the write data coming in along the DQ terminal.

At about 8 clock cycles after the time t1, the data may stop being received, and may be moved to the data bus inversion DBI circuit. At about the same time, the read data may begin being transferred along local input/output buses LIO of the memory to data sense amplifiers DSA. The use of the LIO and DSA may overlap with the column select signal still being active.

At about 12 clock cycles after the time t1, the write data may be transferred from the DBI to the channel. At about the same time, the read data may be transferred from the data sense amplifiers DSA to the read bus LBusRd. This may move the read data (and associated read parity) to a region of the memory which includes shared components such as the ECC circuit.

At about 16 clock cycles after time t1, both the write and read portions of the ECC circuit may become active. The read and write portions may both be active at the same time, since the read and write portions include separate syndrome trees (e.g., 324 and 344 of FIG. 3, respectively). The read portion of the ECC circuit may generate and check a parity based on the read data. The write portion of the ECC circuit may synthesize the new write data from the DQ circuit and the read data together to generate amended write data, and may then generate write parity based on the amended data. The parity based on the read data may be used to correct any errors present in the write parity to generate amended parity.

At about 20 clock cycles after the time t1, the amended write data and the amended parity are provided along the write bus LBusWr to the bank which was specified by the bank address provided along with the mask write command MWR. At about 26 clock cycles after the time t1, the amended write data and parity may be at the bank, and may be provided along the main and local I/O buses MIO and LIO. Column select signals CS may be activated as part of a write operation to provide the bits of the amended write data and parity data along individual bit lines (columns) so that those bits can be written to memory cells at the intersection of those bit lines and activated row(s).

Figure 5:
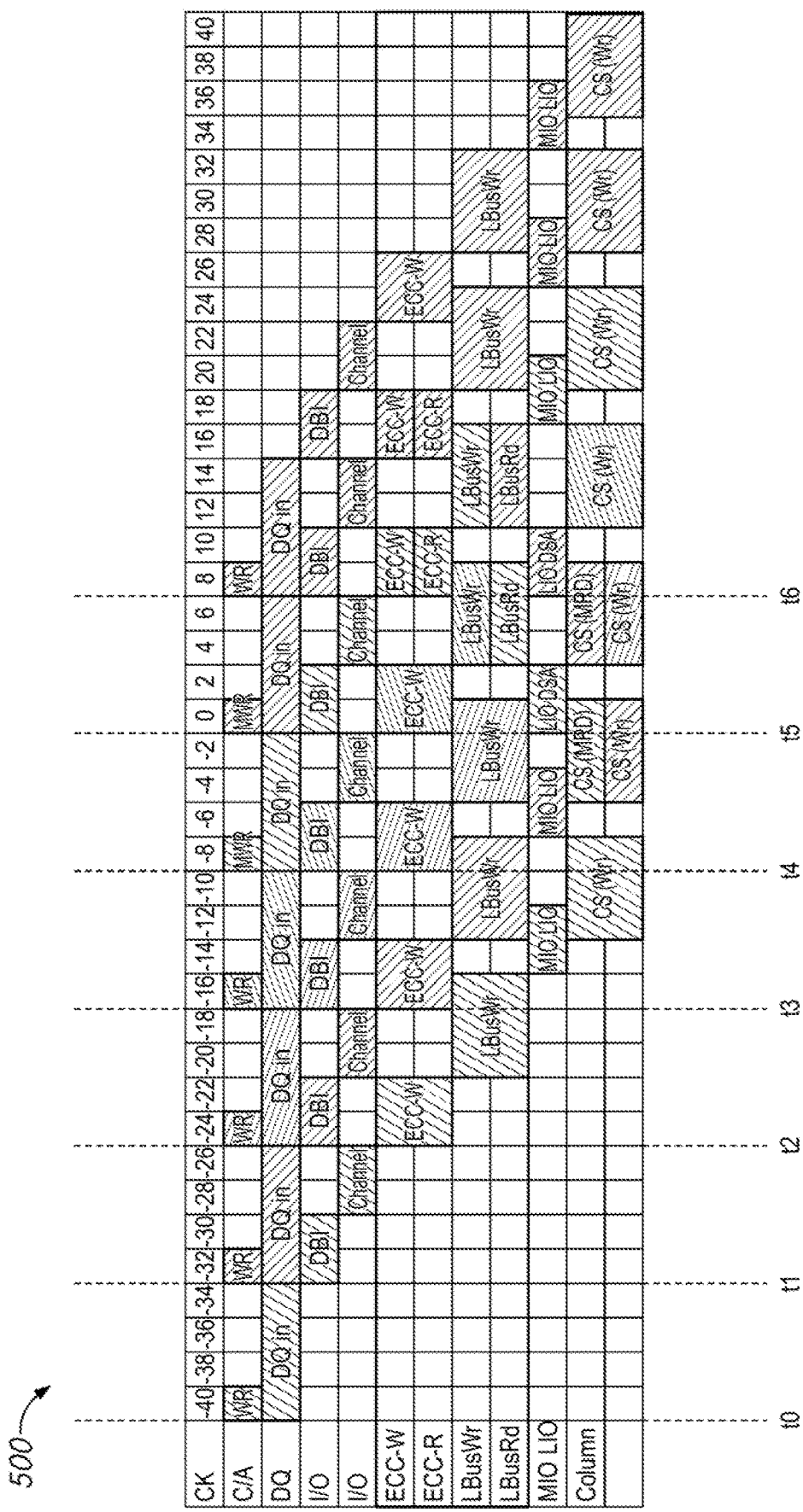
FIG. 5 is a timing diagram of operations in multiple banks according to some embodiments of the present disclosure.

FIG. 5 is a timing diagram of operations in multiple banks according to some embodiments of the present disclosure. The timing diagram 500 of FIG. 5 may be similar to the timing diagram 400 of FIG. 4, except that in the timing diagram 500 command and operations associated with multiple banks are shown (as opposed to the single bank of FIG. 4). For the sake of brevity, features similar to those described in relation to FIG. 4 will not be described again with respect to FIG. 5. Certain operations of the MIO/LIO lines have been omitted for clarity, as these operations are bank specific and operations in different banks may overlap.

In the timing diagram 500, different shading is used to indicate that certain different operations are associated with command issued to different banks. It should be understood that some components (e.g., the MIO and LIO buses, the Columns) are bank specific and the different shading represents different components, while other components (e.g., the ECC circuit, the write and read bus) are shared between the banks, and the shading represents that the shared component is performing tasks associated with data from the indicated bank. Similar to the commands of FIG. 4, the commands of FIG. 5 may represent internal commands issued by the memory (e.g., from command decoder 106 of FIG. 1) in response to external commands provided to the memory (e.g., by a controller).

At an initial time t0, a write command is issued to a first bank. The memory may process the write command in a manner similar to the write command described beginning at t0 in FIG. 4. At a first time t1, a write command is received for a second bank. The first time t1 may be separated from the initial time t0 by the minimum specified time between commands tCCD. In the example of FIG. 5, the time tCCD is 8 clock cycles, and so while the time t0 is at −40 clock cycles (from the 0 time which is at a fifth time t5), the time t1 is at about −32 clock cycles. As may be seen, from time t0 to t1, data associated with the write operation to the first bank is provided along the DQ terminals. However, at the time t1, the DQ terminals start receiving data associated with the write operation to the second bank. Meanwhile, at t1, the data associated with the write operation to the first bank is on the DBI (and then the channel). In this manner, the memory may process commands associated with multiple banks at the same time, since no one component is required to process information associated with both access commands.

At a time t2 (which is tCCD after t1), a third write command is received for a third bank. At a time t3 (which is tCCD after t2), a fourth write command is received for a fourth bank. At a time t4, the first bank receives a mask write command. At the time t4, the DQ terminal is receiving write data associated with the mask write command, the DB1 and channel are processing the data associated with the fourth bank's write command, the (write portion) of the ECC circuit is processing the third bank's data, the write bus is finishing up processing the second bank's data, and the first memory bank is still finishing writing the write data from the write command at t0 along the columns. While there is some overlap between the new mask write command issued at t4, and the original write command issued at t0, there is also a delay between when the first memory bank receives the mask write command (at t4) and when it begins accessing the columns of the first memory bank (e.g., at about 4 clock cycles after t4). Since the column select signal associated with the write command at t0 finishes at about 2 clock cycles after t4, the two operations do not overlap in the column select signals. Note that the column select signal for the mask read operation which is associated with the mask write command received at t4 may overlap with the column select signals being active in other banks (e.g., the second bank as shown) since the banks are separate components from each other.

At a fifth time t5, the second bank receives a mask write command. At a sixth time t6, the second bank receives a (non-mask) write command. The use of separate read and write buses, as well as separate read and write portions of the ECC circuit, may allow the mask write command to be received with tCCD timing, even though the mask write command takes 4*tCCD to complete, and requires both read and write components. For example, shortly after the time t6, the write bus is occupied with data and parity bits associated with the mask write command issued to the first bank at t4, while simultaneously the read bus is occupied by the read data associated with the mask write command issued to the second bank at t5. Similarly, even though the second bank received a mask write command at the time t5, it also received a (non-mask) write command at t6, which is tCCD (e.g., 8 clock cycles) after t5.

Figure 6A:
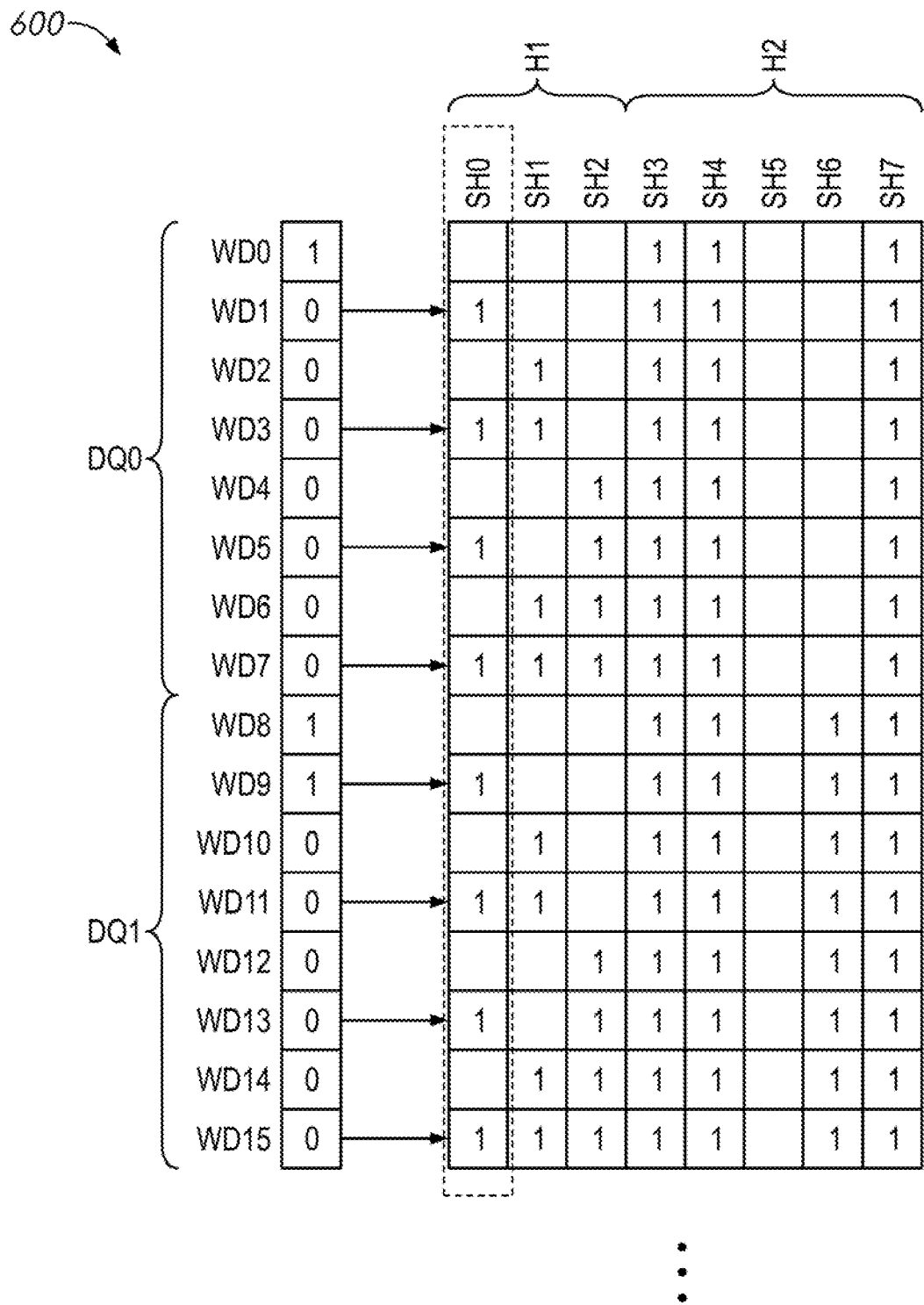
FIGS. 6A to 6C are schematic diagrams of a logic tree according to some embodiments of the present disclosure.
Figure 6B:
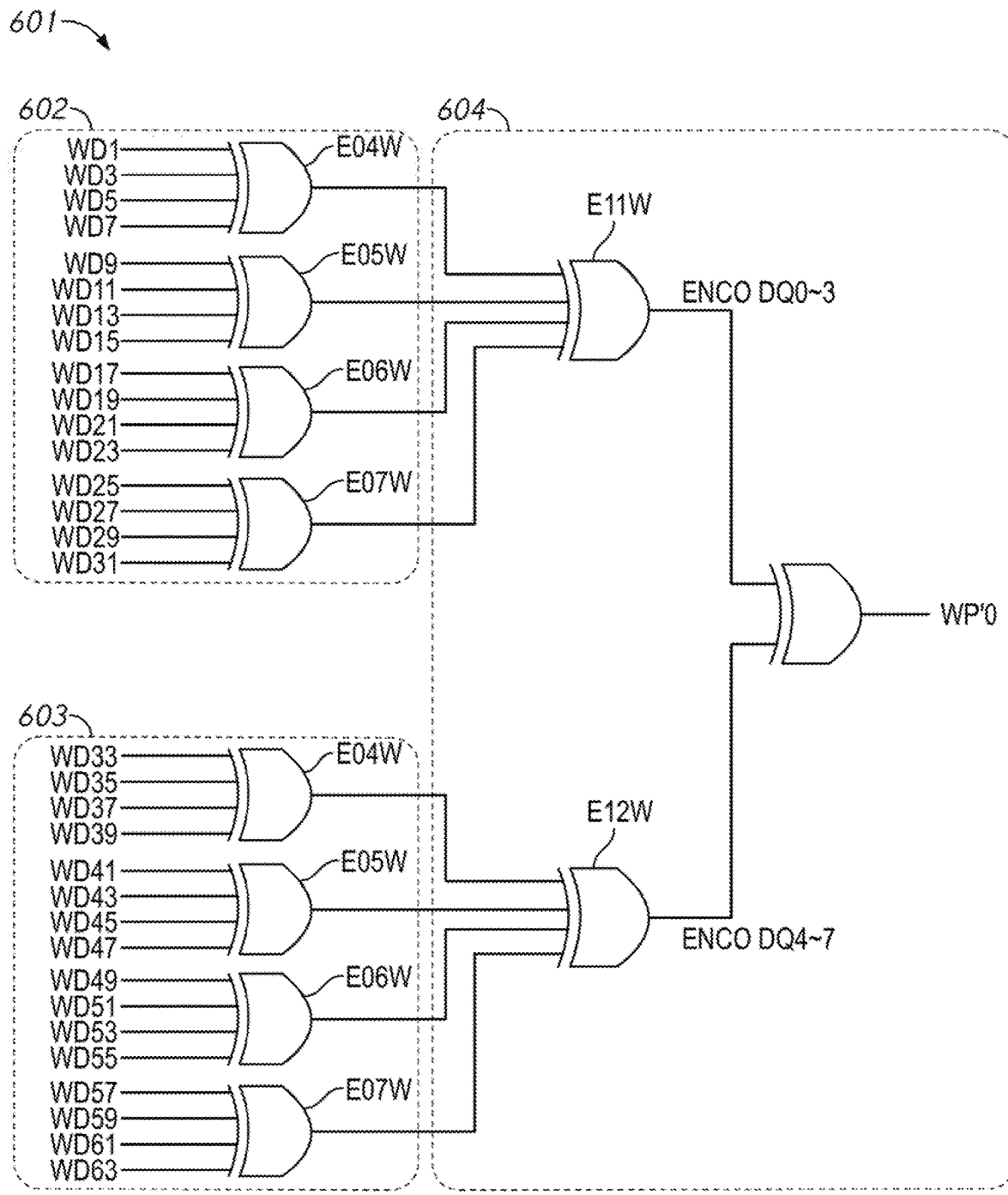
Figure 6C:
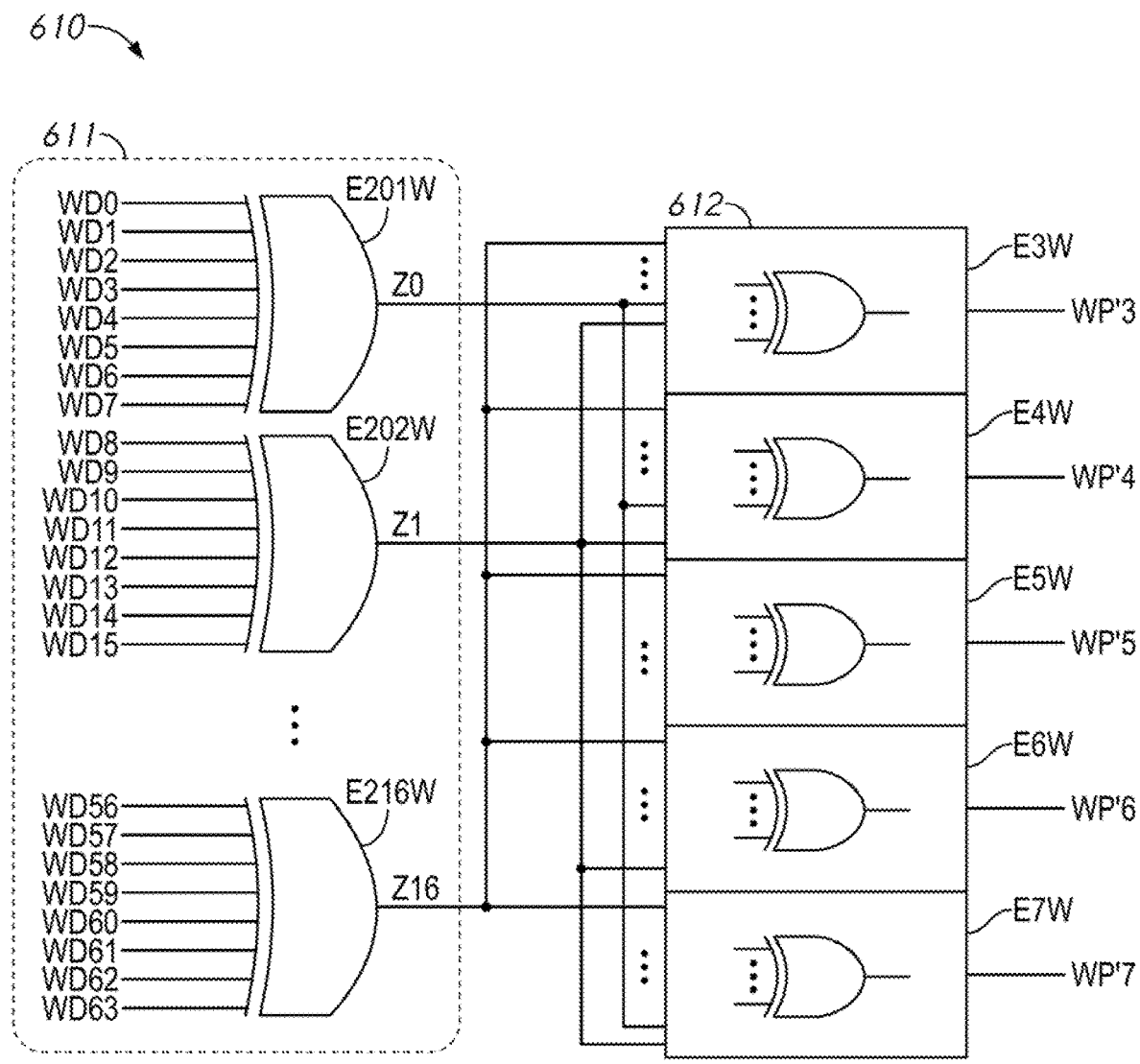

FIGS. 6A to 6C are schematic diagrams of a logic tree according to some embodiments of the present disclosure. FIG. 6A shows a chart 600 which depicts a particular arrangement of logic for generating an encoded bit. FIGS. 6B and 6C show portions 601 and 610 of a logic tree which may be used to implement all or part of the chart 600. The portions 601 and 610 may, in some embodiments, be included in the syndrome tree 324 and/or syndrome tree 344 of FIG. 3. It should be understood that other logical arrangements and logic trees may be used in other example embodiments.

The logic chart 600 and circuits 601 and 610 may represent a portion of a logic tree which is used as part of an access operation such as a read operation, a write operation, and/or a mask write operation to generate parity information. The chart 600 shows data bits arranged in a column along the left side. Each of the rows represents one of the data bits provided as an input to the syndrome tree. In the FIGS. 6A-6C, syndrome tree is labelled as a write syndrome tree (e.g., 344 of FIG. 3) and the input bits are labelled as write data WD, however it should be understood that read data may also be used as an input if the syndrome tree is a read syndrome tree (e.g., 324 of FIG. 3). Similarly while the output of the of the syndrome tree is labelled as write parities WP', read parities may also be generated as the output if the syndrome tree is a read syndrome tree. A read syndrome tree (e.g., 324 of FIG. 3) may include an additional logic gate and/or set of logic gates, such as XOR gates, which compare a read parity to the generated parity based on the read data.

The write bits WD are arranged to correspond to data terminals DQ, and the bits which are received as a burst on that data terminal. In the embodiment shown in FIGS. 6A-6C, there may be 8 data terminals each of which may receive a burst of 8 bits. Other numbers of terminals and bits are possible in other embodiments. The columns of the chart 600 SH0 to SH7 show different syndromes which may be used as encoding for the data bits to generate the parity bits. The columns are arranged into a first determinant H1 which are associated with the logic circuits 601 while the columns arranged in the second determinant H2 are associated with the logic circuits 610.

The logic circuits 601 include a first block 602 of logic circuits and a second block 603 of logic circuits. The blocks 602 and 603 receive the write data bits WD which are indicated with a '1' in the first column SHO of the chart 600. The write data bits are grouped together in groups of 6 (e.g., WD1, WD3, WD5 and WD7) and provided to four input terminals of an exclusive or (XOR) gate. The XOR gate provides an output based on the four inputs. Four such XOR gates (e.g., coupled to 16 WD bits) each provide an output to an XOR gate in a third block 604. The second block 603 is similar to the first block 602, and has four XOR gates coupled to 16 write data WD bits, and provides four outputs to the inputs of an XOR gate in the third block 604. The third block 604 includes two four-input XOR gates coupled to the four outputs of the first block 602 and the four outputs of the second block 603 respectively. In turn these two XOR gates provide outputs which are XOR'd together to produce the write parity bit WP'0, corresponding to the connections of the column SH0 of the chart 600. Similar logic to the circuits 601 may be used to generate the parity bits WP'1 and WP'2 for the next two columns SH1 and SH2 of the chart 600.

The circuits 610 show example logic circuits which may be used to generate the parity bits WP'3 to WP'7 which are associated with the columns SH3 to SH7 of the chart 600. In the circuits 601, there are set number of inputs (e.g., 32 bits) which are active (e.g., marked with a 1) in each column of the chart 600. However, in the circuits 610, there may be different numbers of inputs in the different columns. The circuits 610 include a first block 611 which includes a number of XOR gates which are coupled to the different input bits WD as indicated by the chart 600. The outputs of the XOR gates of the first block 611 are in turn provided as inputs to the XOR gates 612. Each of the XOR gates 612 provide one of the write parity bits WP'.

Figure 7:
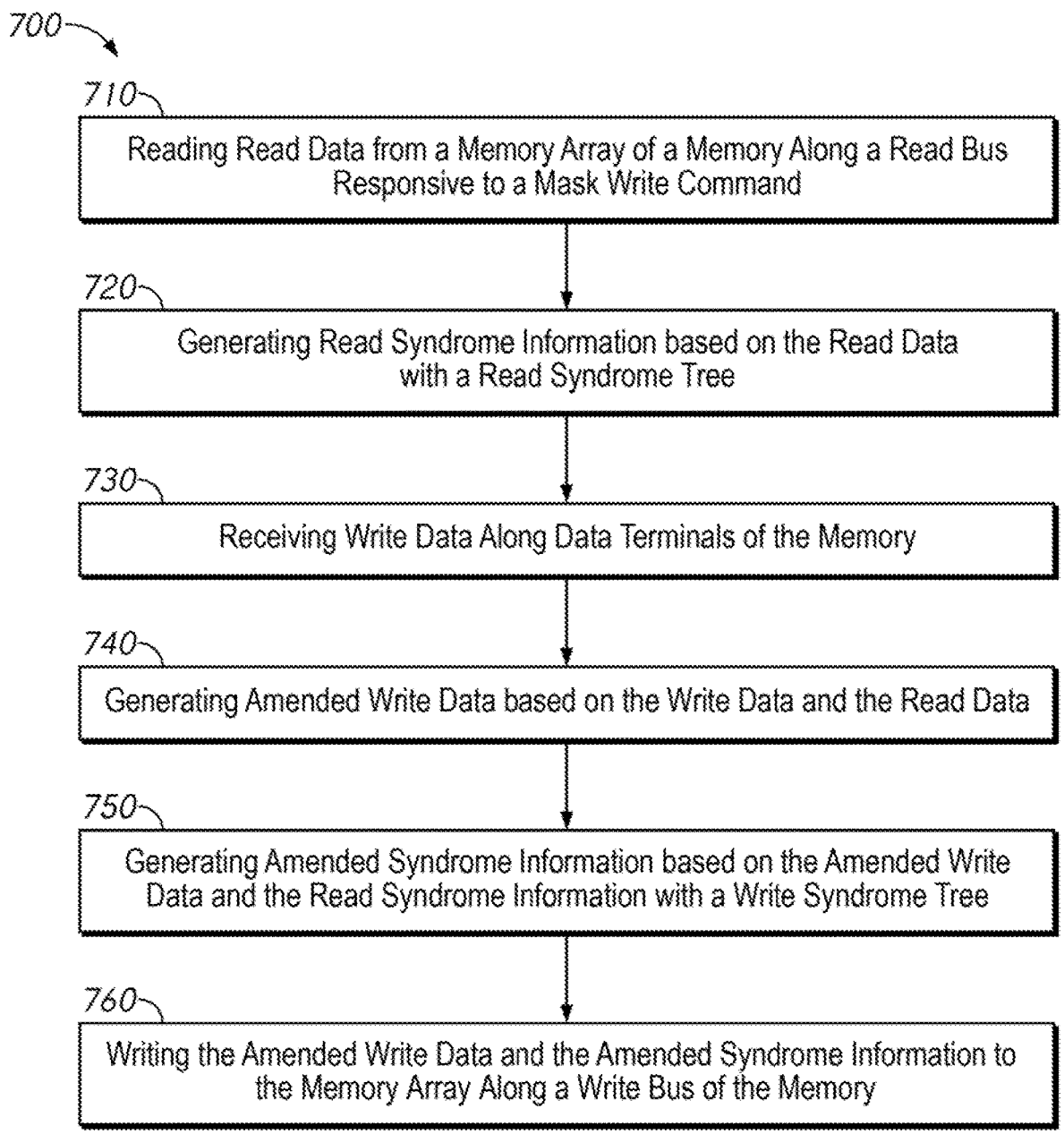
FIG. 7 is a flowchart depicting a method according to some embodiments of the present disclosure.

FIG. 7 is a flowchart depicting a method according to some embodiments of the present disclosure. The method 700 may represent a method of performing a mask write operation using components and timing as described in one or more of FIGS. 1-6C.

The method 700 begins with box 710 which describes reading read data from a memory array of a memory along a read bus responsive to a mask write command. The memory may receive the mask write command at a command/address terminal (C/A) along with a bank, row, and column address which indicate which memory cells should be read. The memory may also receive a data mask signal DM, which may indicate which of the read bits should be overwritten with new data to generate amended data which is written back to the memory cells indicated by the bank, row, and column address. The data may be read out along a data sense amplifier and then provided along the read bus. The read bus may couple the memory array(s) to an ECC circuit.

Box 710 may generally be followed by box 720, which describes generating read syndrome information based on the read data with a read syndrome tree. The read syndrome tree may be part of a read portion of the ECC circuit. The read syndrome information may be checked (e.g., by an error burst check circuit) to determine if there are any errors in the read parity information.

Box 720 may generally be followed by box 730 which describes receiving write data along data terminals of the memory. The write data may represent less bits than are provided as part of a (non-mask) write operation. The write data may be provided as bursts in serial format and then deserialized into a parallel format.

Box 730 may generally be followed by box 740 which describes generating amended write data based on the write data and the read data. A multiplexer of a write portion of the ECC circuit may be used to synthesize the write data and read data together to generate the amended write data. For example, the data mask signal DM may indicate which bits of the read data should be replaced with the write data.

Box 740 may generally be followed by box 750 which describes generating amended syndrome information based on the amended write data and the read syndrome information with a write syndrome tree. The ECC circuit may include a read syndrome tree as part of a read portion of the ECC circuit. The read syndrome tree may generate parity information based on the amended write data, which may be edited based on detected errors in the read parity information to generate the amended syndrome information.

Box 750 may generally be followed by box 760 which describes writing the amended write data and the amended syndrome information to the memory array along a write bus of the memory. The amended write data may be provided along the write bus back to the memory array and written to the bank, row(s), and column(s) indicated by the bank row and column addresses.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a memory bank;
   a data terminal;
   a write bus;
   a read bus;
   a write portion of an error correction code (ECC) circuit configured to receive write data from the data terminal, generate a parity bit based on the write data, and provide the write data and parity data along the write bus to the memory bank; and
   a read portion of the ECC circuit configured to receive read data and read parity from the memory bank along the read bus, and generate read syndrome information based on the read data and the read parity,
   wherein the read portion of the ECC circuit includes an error burst check circuit configured to check the read syndrome information for errors, and wherein the write portion of the ECC circuit includes a parity edit circuit configured to correct the parity bit based errors in the read syndrome information as part of a mask write operation.

2. An apparatus comprising:
   a memory bank;
   a data terminal;
   a write bus;
   a read bus;
   a write portion of an error correction code (ECC) circuit configured to receive write data from the data terminal, generate a parity bit based on the write data, and provide the write data and parity data along the write bus to the memory bank; and
   a read portion of the ECC circuit configured to receive read data and read parity from the memory bank along the read bus and generate read syndrome information based on the read data and the read parity,
   wherein the write portion of the ECC circuit includes a write syndrome tree and the read portion of the ECC circuit includes a read syndrome tree.

3. An apparatus comprising:
   a memory bank;
   a data terminal;
   a write bus;
   a read bus;
   a write portion of an error correction code (ECC) circuit configured to receive write data from the data terminal generate a parity bit based on the write data, and provide the write data and parity data along the write bus to the memory bank; and
   a read portion of the ECC circuit configured to receive read data and read parity from the memory bank along the read bus, and generate read syndrome information based on the read data and the read parity,
   wherein the write portion of the ECC circuit operates with timing based on a first clock signal and the read portion of the ECC circuit operates with timing based on a second clock signal.

4. The apparatus of claim 1, further comprising a second memory bank, wherein the write bus is coupled in common to the memory bank and the second memory bank, and wherein the read bus is coupled in common to the memory bank and the second memory bank.

5. The apparatus of claim 1, wherein the read portion of the ECC circuit includes a correction circuit configured to generate corrected read data based on the read data, the read parity, and the read syndrome information as part of a read operation.

6. An apparatus comprising:
   a memory bank;
   a data terminal;
   a write bus;
   a read bus;
   a write portion of an error correction code (ECC) circuit configured to receive write data from the data terminal, generate a parity bit based on the write data, and provide the write data and parity data along the write bus to the memory bank; and
   a read portion of the ECC circuit configured to receive read data and read parity from the memory bank along the read bus, and generate read syndrome information based on the read data and the read parity,
   wherein the write portion of the ECC circuit includes a multiplexer configured to generate amended write information based on the read data and the write data and provide the amended write information along the write bus to a memory array as part of a mask write operation.

7. An apparatus comprising:
   a read syndrome tree configured to receive read data along a read bus and provide syndrome information based on the read data;
   a latch configured to store the read data from the read bus;
   a multiplexer configured to receive the read data from the latch and write data from a data terminal and provide amended write data along a write bus based on the read data and the write data; and
   a write syndrome tree configured to receive the amended write data and generate write parity based on the amended write data,
   wherein the read syndrome tree operates with timing based on a first clock signal, the latch operates with timing based on a second clock signal, and the multiplexer and the write syndrome tree operate with timing based on a third clock signal.

8. The apparatus of claim 7, further comprising a data sense amplifier configured to receive the read data from a memory array and provide it along the read bus, wherein the data sense amplifier operates with timing based on a fourth clock signal.

9. The apparatus of claim 7, further comprising an error burst check circuit configured to provide error information based on the syndrome information, wherein the error burst check circuit operates with timing based on the second clock signal.

10. The apparatus of claim 9, further comprising a parity edit circuit configured to provide amended write parity based on the write parity and the error information, wherein the parity edit circuit operates with timing based on the third clock signal.

11. The apparatus of claim 7, wherein the amended write data is written to a memory array as part of a mask write operating.

12. The apparatus of claim 7, further comprising a memory array coupled to the read syndrome tree along the read bus and coupled to the write syndrome tree along the write bus.

13. The apparatus of claim 12, further comprising a write driver configured to write the amended write data and the write parity to the memory array with timing based on the third clock signal.

14. A method comprising:
reading read data from a memory array of a memory along a read bus responsive to a mask write command;
generating read syndrome information based on the read data with a read syndrome tree;
receiving write data along data terminals of the memory;
generating amended write data based on the write data and the read data;
generating amended syndrome information based on the amended write data and the read syndrome information with a write syndrome tree; and
writing the amended write data and the amended syndrome information to the memory array along a write bus of the memory.

15. The method of claim 14, further comprising checking the read syndrome information for errors with an error burst check circuit.

16. The method of claim 14, further comprising generating the read syndrome information simultaneous to generating the amended syndrome information.

17. The method of claim 14, further comprising reading read data associated with a first command along the read bus simultaneous to writing the amended write data associated with a second command along the write bus.

18. The method of claim 14, further comprising generating the read syndrome information with timing based on a first clock domain and generating the amended syndrome information with timing based on a second clock domain.

19. The method of claim 18, further comprising reading the read data with timing based on a third clock domain.

* * * * *